United States Patent
Cho et al.

(10) Patent No.: US 8,706,953 B2
(45) Date of Patent: Apr. 22, 2014

(54) DATA STORAGE DEVICE AND METHOD PERFORMING BACKGROUND OPERATION WITH SELECTED DATA COMPRESSION

(75) Inventors: Kyoung Lae Cho, Yongin-si (KR); Kwang Ho Kim, Hwaseong-si (KR); Jun Jin Kong, Yongin-si (KR); Jaehong Kim, Seoul (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 13/096,036

(22) Filed: Apr. 28, 2011

(65) Prior Publication Data

US 2011/0276777 A1    Nov. 10, 2011

(30) Foreign Application Priority Data

May 10, 2010    (KR) .................. 10-2010-0043612

(51) Int. Cl.
*G06F 12/02* (2006.01)
(52) U.S. Cl.
USPC ..... 711/103; 711/171; 711/202; 711/E12.009
(58) Field of Classification Search
None
See application file for complete search history.

(56) References Cited

U.S. PATENT DOCUMENTS

| | | | |
|---|---|---|---|
| 5,623,701 A * | 4/1997 | Bakke et al. ............. | 710/68 |
| 7,380,060 B2 * | 5/2008 | Guha et al. ............. | 711/114 |
| 7,433,994 B2 * | 10/2008 | Petersen et al. ............. | 711/103 |
| 7,596,657 B2 * | 9/2009 | Kaler ............. | 711/103 |
| 8,135,902 B2 * | 3/2012 | Kurashige ............. | 711/103 |
| 8,135,903 B1 * | 3/2012 | Kan ............. | 711/103 |
| 2002/0116424 A1 * | 8/2002 | Radermacher et al. ....... | 708/203 |
| 2004/0098545 A1 * | 5/2004 | Pline et al. ............. | 711/154 |
| 2004/0250011 A1 | 12/2004 | Chen et al. | |
| 2006/0271761 A1 * | 11/2006 | Riemens ............. | 711/212 |
| 2008/0172525 A1 * | 7/2008 | Nakamura et al. ............. | 711/113 |
| 2009/0112949 A1 * | 4/2009 | Ergan et al. ............. | 707/205 |
| 2009/0282064 A1 * | 11/2009 | Raju et al. ............. | 707/101 |
| 2009/0310408 A1 * | 12/2009 | Lee et al. ............. | 365/185.03 |
| 2010/0011150 A1 | 1/2010 | Klein | |
| 2010/0023682 A1 | 1/2010 | Lee et al. | |
| 2010/0077133 A1 * | 3/2010 | Jeon ............. | 711/103 |
| 2010/0306491 A1 * | 12/2010 | Yoo et al. ............. | 711/165 |
| 2011/0004728 A1 * | 1/2011 | Schuette ............. | 711/113 |

FOREIGN PATENT DOCUMENTS

JP    2002196797 A    7/2002

OTHER PUBLICATIONS

Lee et al., "Improving Performance and Lifetime of Solid-State Drives Using Hardware-Accelerated Compression", IEEE Transactions on Consumer Electronics, vol. 57, No. 4, Nov. 2011, pp. 1732-1739.*

Huang et al., "A Compression Layer for NAND Type Flash Memory Systems", Proceedings of the Third International Conference on Information Technology and Applications (ICITA '05), Jul. 4-7, 2005, vol. 1, pp. 599-604.*

(Continued)

*Primary Examiner* — April Y Blair
*Assistant Examiner* — Michael C Kolb
(74) *Attorney, Agent, or Firm* — Volentine & Whitt, PLLC

(57) ABSTRACT

A method of storing data in a storage medium of a data storage device comprises storing input data in the storage medium, and reading the input data from the storage medium and compressing the read data during a background operation of the data storage device.

12 Claims, 20 Drawing Sheets

(56) References Cited

OTHER PUBLICATIONS

Agrawal et al., "Design Tradeoffs for SSD Performance", Proceedings of the USENIX Technical Conference, Jun. 2008, pp. 57-70.*

Yim et al., "A Flash Compression Layer for SmartMedia Card Systems", IEEE Transactions on Consumer Electronics, vol. 50, No. 1, Feb. 2004, pp. 192-197.*

* cited by examiner

Data Storage Device

Fig. 3

| LBN | PBN | FBC |
|---|---|---|
| 0 | 100 | 0 |
| 1 | 101 | 0 |
| 2 | 103 | 0 |
| 3 | 104 | 1 |
| 4 | 205 | 1 |
| 5 | 206 | 1 |

10

| DGN | PBN |
|---|---|
| 0 | 300 |
|   | 400 |
| 1 | 500 |
|   |   |
|   |   |

11

| DGN | LLN | PLN | FBC |
|---|---|---|---|
| 0 | 3 | 1200 | 0 |
|   | 4 | 1201 | 0 |
|   | 6 | 1202 | 0 |
|   | 7 | 1203 | 0 |
|   |   |   |   |
| 1 | 10 | 2000 | 1 |
|   | 11 | 2001 | 1 |
|   |   |   |   |
|   |   |   |   |
|   |   |   |   |
|   |   |   |   |

12

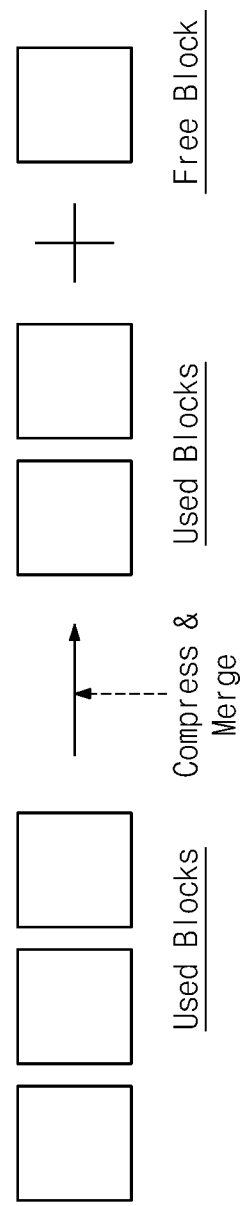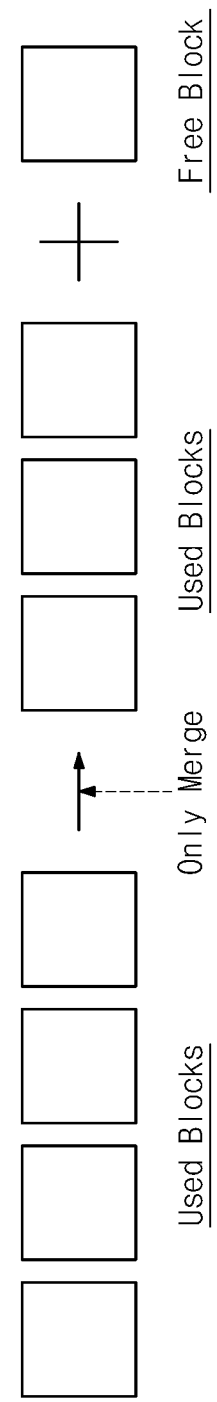

DATA STORAGE DEVICE AND METHOD PERFORMING BACKGROUND OPERATION WITH SELECTED DATA COMPRESSION

CROSS-REFERENCE TO RELATED APPLICATIONS

This application claims priority under 35 U.S.C. §119 to Korean Patent Application No. 10-2010-0043612 filed on May 10, 2010, the disclosure of which is hereby incorporated by reference in its entirety.

BACKGROUND OF THE INVENTION

Embodiments of the inventive concept relate generally to electronic data storage technologies. More particularly, embodiments of the inventive concept relate to electronic data storage devices and related methods of operation.

Most computing systems include a memory system. The memory system typically comprises different memory components that provide different levels of storage and performance according to different functions of a host device. For instance, most memory systems include a main memory that stores data to be accessed quickly and with relative frequency by the host device, and a long term memory for storing large amounts of data requiring less frequent access by the host device.

In recent years, an increasing number of computing systems have incorporated solid state drives (SSDs) as a major component of their memory systems. An SSD is a type of memory device that stores data in a solid state medium rather than a magnetic platter as in hard disk drives. The term "SSD" can refer to two different types of products, including those that incorporate a volatile memory such as a synchronous dynamic random access memory (SDRAM), and those that incorporate a nonvolatile memory such as a flash memory. The first type of SSD is commonly used as a main memory, and the second type of SSD is commonly used as a long term memory.

SUMMARY OF THE INVENTION

According to one embodiment of the inventive concept, a method of storing data in a storage medium of a data storage device comprises storing input data in the storage medium, and reading the input data from the storage medium and compressing the read data during a background operation of the data storage device.

According to another embodiment of the inventive concept, a data storage device comprises a storage medium comprising memory blocks, a memory translation layer configured to select memory blocks of the storage medium in which input data is to be stored, and a compression block configured to compress data stored in the selected memory blocks during a background operation of the data storage device.

According to another embodiment of the inventive concept, a method of operating a data storage device comprises storing input data in a log block, updating a log block mapping table to reflect the storage of the input data in the log block, and during a background operation of the data storage device, reading the input data from the log block, compressing the read input data to produce compressed data, and storing the compressed data in a data block. The method further comprises updating a data block mapping table to reflect storage of the compressed data in the data block.

BRIEF DESCRIPTION OF THE DRAWINGS

The drawings illustrate selected embodiments of the inventive concept. In the drawings, like reference numbers indicate like features.

FIG. 3 is a diagram illustrating tables managed by a memory translation layer in a data storage device according to an embodiment of the inventive concept.

FIGS. 10A and 10B are diagrams illustrating different merging schemes that can be used in the merge operation of FIG. 9.

DETAILED DESCRIPTION

Figure 1:
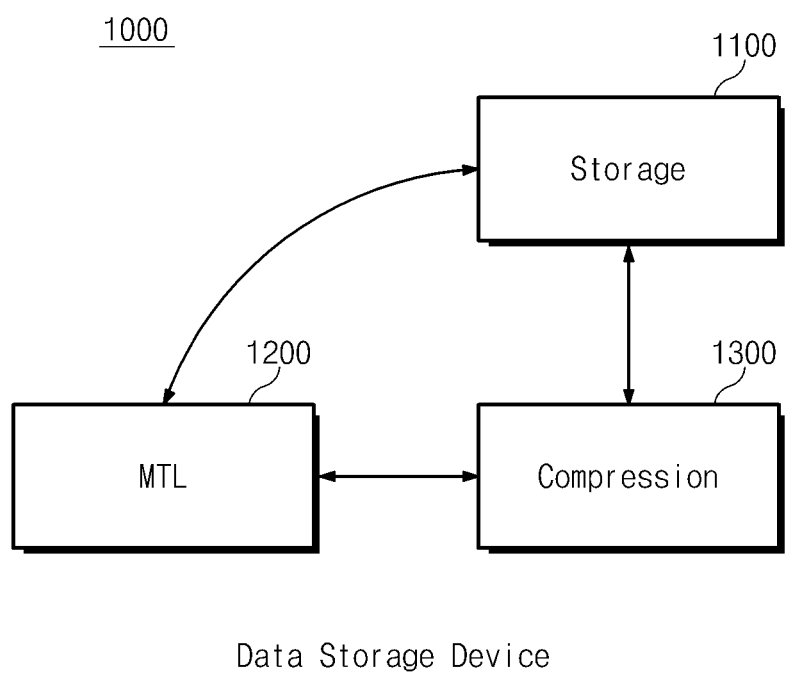
FIG. 1 is a block diagram illustrating a data storage device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms first, second, third, etc., are used to describe various features, but the inventive concept should not be limited by these terms. Rather, these terms are only used to distinguish between different features. Accordingly, a first feature could alternatively be termed a second feature without departing from the scope of the inventive concept.

Spatially relative terms, such as "beneath", "below", "lower", "under", "above", and "upper" are used herein to describe various features or relationships between features. These spatially relative terms are intended to encompass different orientations of the device in use or operation in addition to the orientations depicted in the figures. For example, where a device in the figures is turned over, features described as "below" or "beneath" or "under" other features are then oriented "above" the other features. Thus, a term such as "below" or "under" can encompass both an orientation of above and below. Devices can be otherwise oriented (e.g., rotated 90 degrees or otherwise), with spatially relative descriptors interpreted accordingly. In addition, where a feature is referred to as being "between" two other features, it can be the only feature between the two other features, or one or more intervening features may also be present.

The terminology used herein is for the purpose of describing particular embodiments only and is not intended to limit the inventive concept. As used herein, the singular forms "a", "an", and "the" are intended encompass plural forms as well, unless the context clearly indicates otherwise. The terms "comprises" and/or "comprising," where used in this description, indicate the presence of stated features but do not preclude the presence or addition of one or more other features. As used herein, the term "and/or" encompasses any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this description and will not be interpreted in an idealized or overly formal sense unless expressly so defined herein.

FIG. 1 is a block diagram illustrating a data storage device 1000 according to an embodiment of the inventive concept.

Referring to FIG. 1, data storage device 1000 comprises a storage medium 1100, a memory translation layer (MTL) 1200, and a compression block 1300.

Storage medium 1100 is used to store various types of data such as text, graphics, and software code. Storage medium 1100 typically comprises a nonvolatile memory such as a PRAM, FeRAM, or MRAM. However, storage medium 1100 can take other forms as well.

MTL 1200 controls storage medium 1100 to store information received from an external source. MTL 1200 can also be used for other purposes such as management of wear-leveling, bad blocks, and data retention in the presence of an unexpected power interruption.

Compression block 1300 is configured to compress data stored in storage medium 1100. Compression block 1300 typically compresses data stored in storage medium 1100 during a background operation of data storage device 1000. The background operation is typically performed by data storage device 1000 without a request from an external device such as a host.

Because data compression is performed during a background operation, data is not compressed when it is transferred to storage medium 1100 from an external source, as will be described in further detail below. Accordingly, the background compression operation can improve the performance of data storage device 1000.

Figure 2:
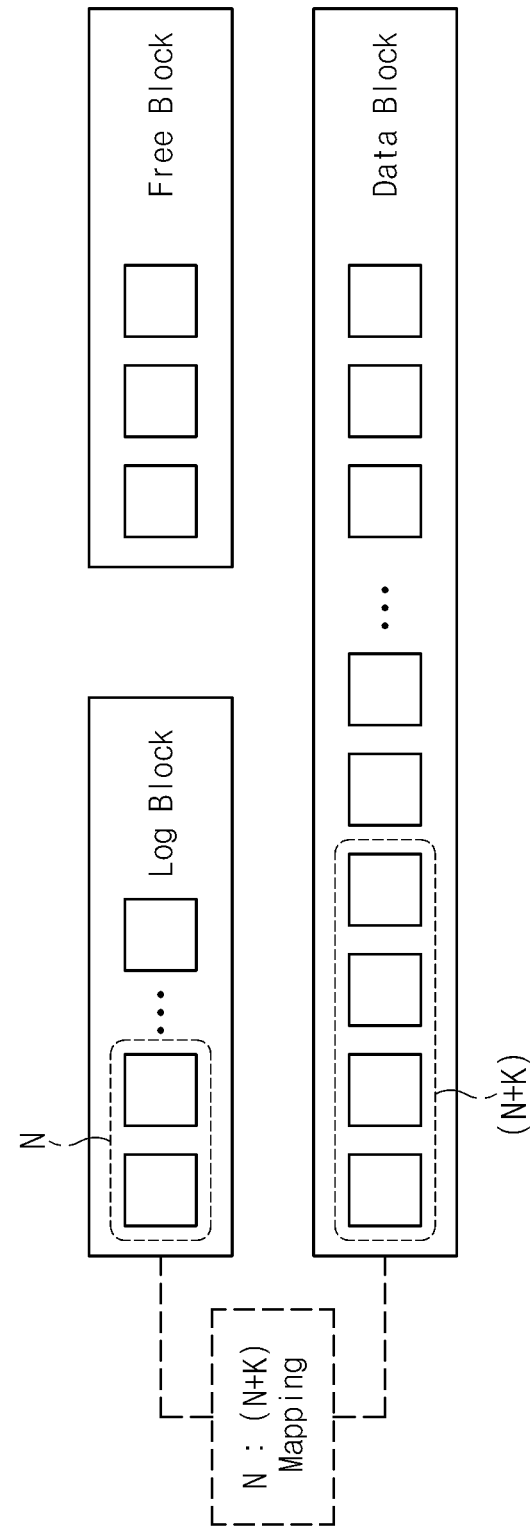
FIG. 2 is a diagram illustrating a log mapping scheme used by a data storage device according to an embodiment of the inventive concept.

FIG. 2 is a diagram illustrating a log mapping scheme used by a data storage device according to an embodiment of the inventive concept.

Referring to FIG. 2, MTL 1200 divides memory blocks of storage medium 1100 into data blocks, log blocks, and free blocks. A data block is a memory block in which data provided from an external source is to be stored. A log block is a memory block in which data is temporarily retained before it is stored in a data block. The log block functions as a write buffer of data storage device 1000 or storage medium 1100.

In a write operation of data storage device 1000, input data is initially stored in log blocks. Filled or partially filled log blocks can then be changed into data blocks. Log blocks and data blocks have an N:(N+K) mapping relationship. In other words, N log blocks are mapped onto (N+K) data blocks.

Figure 4:
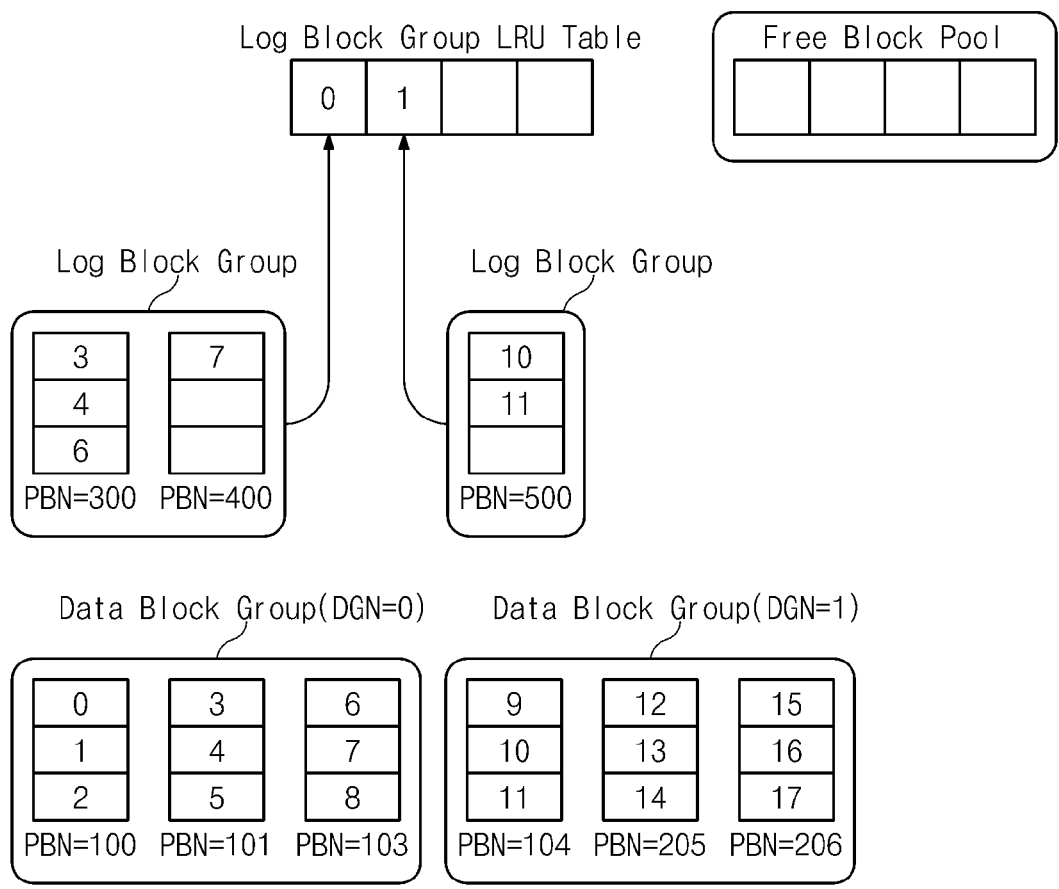
FIG. 4 is a diagram illustrating mapping relationships between log blocks and data blocks in a write operation of a data storage device according to an embodiment of the inventive concept.

FIG. 3 is a diagram illustrating tables managed by MTL 1200 in data storage device 1000 according to an embodiment of the inventive concept. FIG. 4 is a diagram illustrating mapping relationships between log blocks and data blocks in a write operation of data storage device 1000 according to an embodiment of the inventive concept. The write operation is performed on a logical write unit (LWU), such as a page.

In FIG. 3, the label "LBN" indicates a logical block number, and the label "PBN" indicates a physical block number. The label "LLN" indicates a logical LWU number, and the label "PLN" indicates a physical LWU number. The label "DGN" indicates a data block group number, and the label "FBC" indicates values of flag bits.

The tables managed by memory translation layer 1200 include a data block mapping table 10, a log block mapping table 11, and an LWU mapping table 12. The tables can further include a compression mapping table, a log block group LWU table, and others. The compression mapping table typically comprises flag bit information indicating whether data stored in a memory block is compressed data or raw data (or uncompressed data). The compression mapping table is typically incorporated in data block mapping table 10 as illustrated by a dotted line in FIG. 3 or in LWU mapping table 12 as illustrated by a dotted line in FIG. 3.

Flag bits FBC of blocks 100, 101, and 103 are set to '0' to indicate that raw data is stored in blocks 100, 101, and 103. Flag bits FBC of blocks 104, 205, and 206 are set to '1' to indicate that compressed data is stored in blocks 104, 205, and 206. Such flag bit information can be stored in the compression block table when data is transferred to data storage device 1000 from an external source and/or when data compression is performed. Flag bit information can also be stored at a header/footer of data or a spare area in which data is stored rather than in the compression mapping table.

For explanation purposes, it will be assumed that the LWU corresponds to a page of data. It will be further assumed that data storage device 1000 receives a command to store two pages of data from a logical LWU number LLN3. Where no block is assigned to a log block, memory translation layer 1200 assigns a free block in a free block pool (e.g., a free block PBN300) to a log block and then generates a log block group for a data block group DGN0.

Logical LWU numbers LLN3 and LLN4 are mapped to first and second pages 1200 and 1201 of the assigned log block PBN300. Memory translation layer 1200 stores such mapping information in LWU mapping table 12. LWU mapping table 12 stores flag bit information FBC indicating whether data is uncompressed/raw data or compressed data. Memory translation layer 1200 assigns compressed data to a different data block from uncompressed data.

Where data storage device 1000 receives a command for storing two pages of data corresponding to a logical LWU number LLN6, the data of logical LWU number LLN6 is stored in log block PBN300, or, if log block PGN300 contains insufficient space to store the data, memory translation layer 1200 assigns a free block from the free block pool to a new log block PBN400. Log block PBN400 is added to data block group DGN0, and then data of logical LWU number LLN7 is stored in log block PBN400.

Next, it is assumed that data storage device 1000 receives a command to store two pages of data corresponding to a logical LWU number LLN10. Because logical LWU number LLN10 is not mapped to data block group DGN0, a new log block PBN500 is assigned. Memory translation layer 1200 generates a data block group DGN1 having a newly assigned log block PBN500. Because flag bit information FBC is '1', it is possible to determine whether data to be stored in a log block is compressed data. Data corresponding to logical LWU numbers LLN10 and LLN11 is stored in a newly assigned log block PBN500, and then mapping information is stored in LWU mapping table 12.

The above-described operations are carried out until there is no remaining free block in the free block pool. Where there is no free block in the free block pool, an erase operation is carried out. Using the above mapping operations, a data block group can generally be mapped to a log block group.

Figure 5:
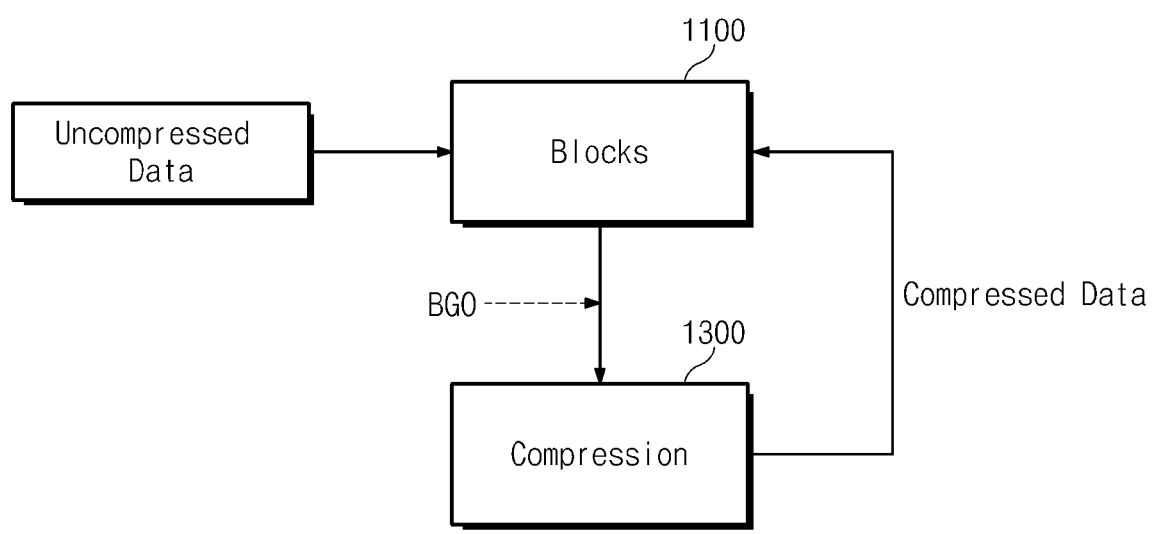
FIG. 5 is a diagram illustrating a compression operation of a data storage device according to an embodiment of the inventive concept.

FIG. 5 is a diagram illustrating a compression operation of data storage device 1000 according to an embodiment of the inventive concept.

Data provided to data storage device 1000 is initially stored in assigned blocks (e.g., log blocks) of a storage medium without data compression. Data stored in the assigned blocks is then compressed by compression block 1300 in a background operation BGO of data storage device 1000, and resulting compressed data is stored in other assigned blocks (e.g., data blocks) of storage medium 1100. Background operation BGO can include, for instance, a merge operation, an idle operation, a copy-back operation, etc.

In the idle operation of data storage device 1000, for example, data stored in a log block of storage medium 1100 is compressed by compression block 1300 under the control of memory translation layer 1200, and the compressed data is stored in a data block assigned by memory translation layer 1200. In a merge operation of part of background operation BGO, data of blocks to be merged (e.g., log blocks and data blocks) is compressed by compression block 1300. In a copy-back operation of background operation BGO, data of a source block is compressed by compression block 1300, and compressed data is stored in a target block. The merge operation, the idle operation, and the copy-back operation are examples of background operation BGO. However, background operation BGO can take other forms. In addition, operations such as data compression can be performed in an operation accompanying data transfer between memory blocks within data storage device 1000 without a host request.

Input data provided to data storage device 1000 can be uncompressed/raw data and/or compressed data. Accordingly, data storage device 1000 typically determines whether the input data is compressed data before storing it in storage medium 1100. A result of this determination is then stored in the above-described compression mapping table, a spare area of a memory block in which the input data is to be stored, or a header/footer of the input data. An external device, such as a host, can provide information indicating whether input data provided to data storage device 1000 is compressed data. Where no such information is provided to data storage device 1000, data storage device 1000 can be configured to determine whether the input data comprises compressed data, as will be described with reference to FIG. 6.

Figure 6:
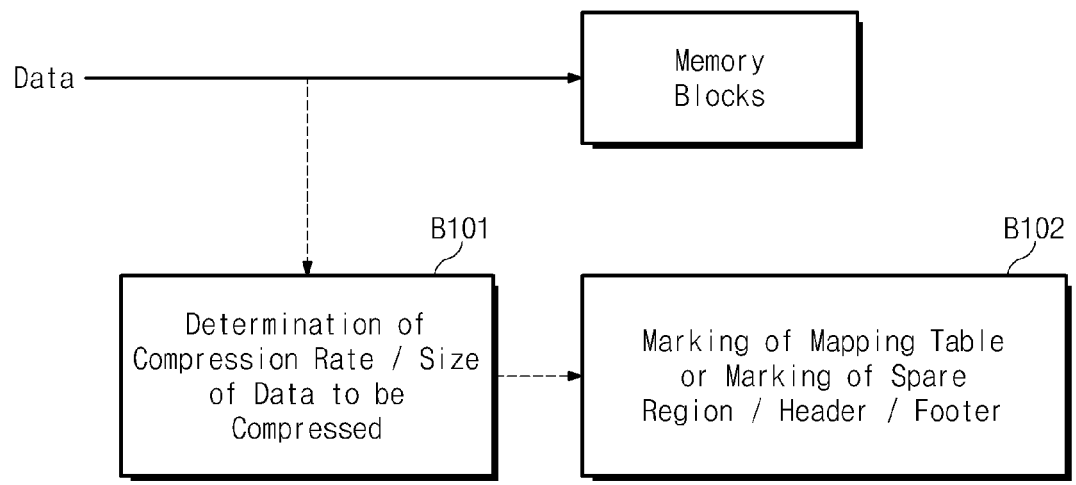
FIG. 6 is a diagram illustrating an operation for determining compression parameters in a data storage device according to an embodiment of the inventive concept.

FIG. 6 is a diagram illustrating an operation for determining compression parameters in data storage device 1000 according to an embodiment of the inventive concept.

Where data storage device 1000 does not receive an indication of whether input data is compressed, data storage device 1000 analyzes the input data and generates an indication of whether it is compressed. The generated indication typically comprises flag bit information.

In the example of FIG. 6, a functional block B101 of data storage device 1000 determines a compression rate of input data to be stored in memory blocks. Data storage device 1000 determines whether the input data is compressed data based on the determined compression rate. A functional block B102 stores a result of the determination in a spare area of a memory block in which the input data is to be stored, or in a header or footer of the input data.

Alternatively, functional block B101 can predict a compressed size of the input data using a predetermined compression rate. Data storage device 1000 can then determine whether the input data is compressed data based on the predicted data size. Functional block B102 can then store a result of the determination in a spare area of a memory block in which input data is to be stored or in a header or footer of the input data.

In some embodiments, prediction of the compression rate/data size is performed by compression block 1300 upon receipt of the input data in data storage device 1000 from an external source. Alternatively, prediction of the compression rate/data size can be made by compression block 1300 upon transfer of the input data to a memory block.

Figure 7:
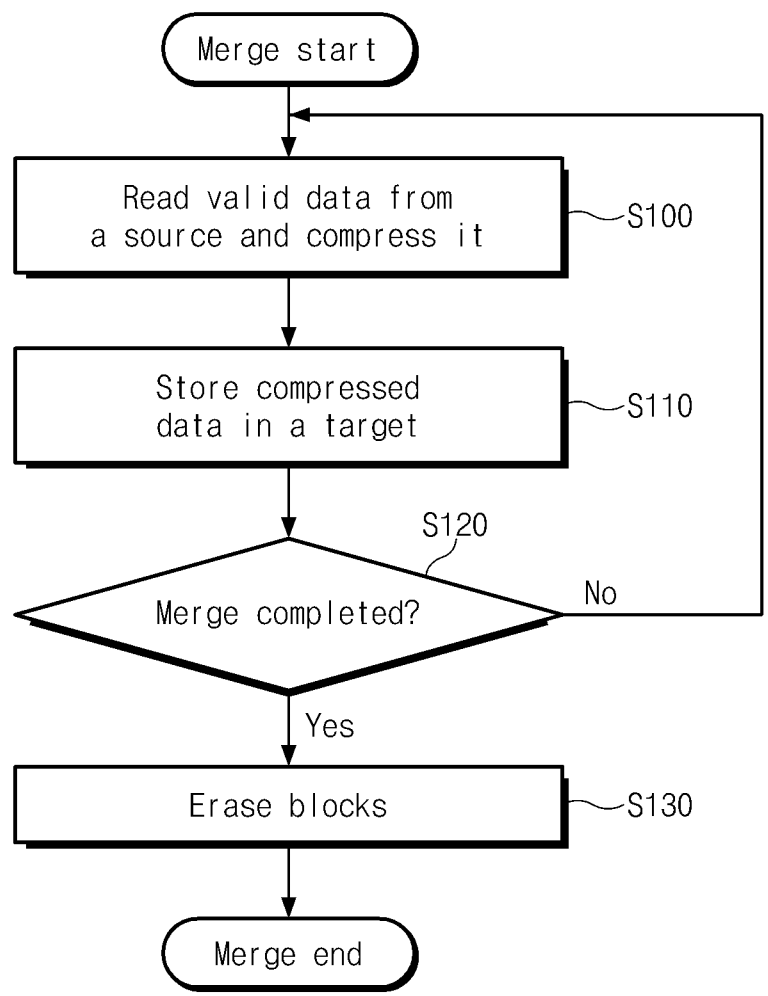
FIG. 7 is a flowchart illustrating a merge operation of a data storage device according to an embodiment of the inventive concept.
Figure 8:
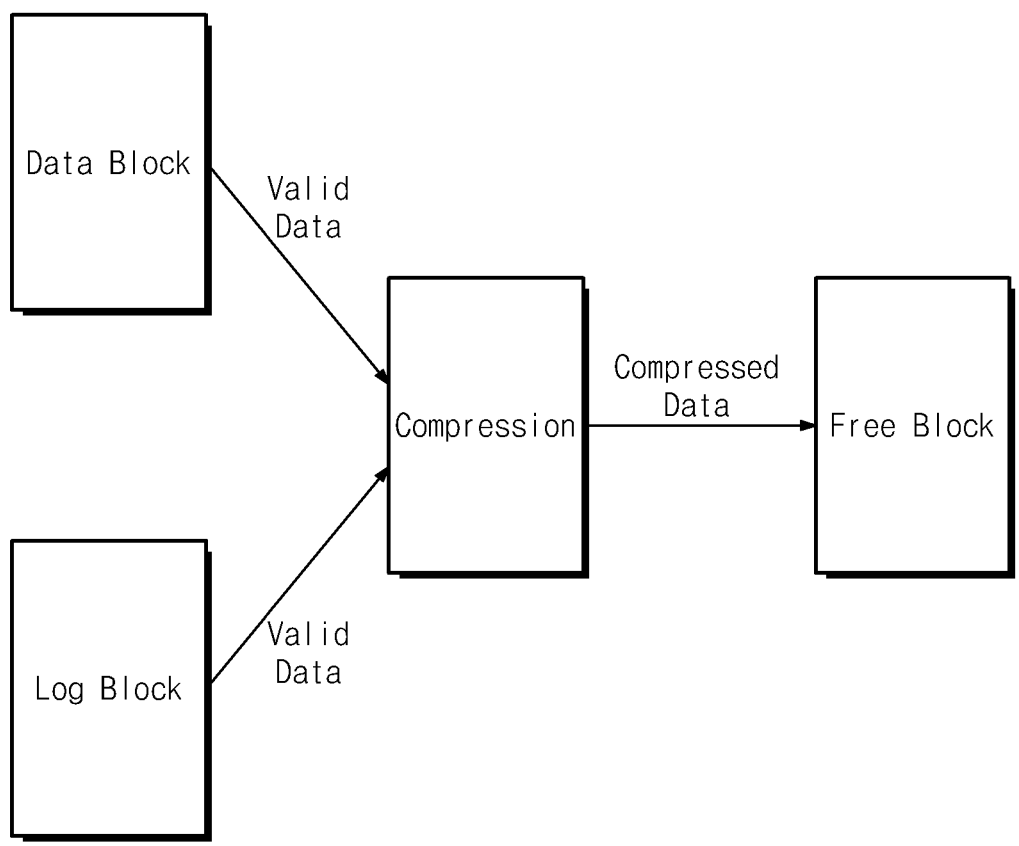
FIG. 8 is a diagram illustrating data flow in a merge operation of a data storage device according to an embodiment of the inventive concept.

FIG. 7 is a flowchart illustrating a merge operation of data storage device 1000 according to an embodiment of the inventive concept. FIG. 8 is a diagram illustrating data flow in the merge operation of data storage device 1000 according to an embodiment of the inventive concept.

The merge operation is typically used to create a free block where a specific condition is satisfied. The specific condition can include, for instance, the number of free blocks in a free block pool falling below a predetermined number, a program/erase cycle number of a memory block exceeding a predetermined number, or prolonged retention of data in a log block. Memory translation layer 1200 starts the merge operation upon detecting that the specific condition has been satisfied.

Once the merge operation commences, valid data is read out from a source block and compressed (S100). As indicated by FIG. 8, the source block can include, for instance, a data block and a log block. Alternatively, the source block can include a data block or a log block. Valid data read from a source block (a data block or a log block) is compressed by compression block 1300.

Next, the compressed data is stored in a free block assigned by memory translation layer 1200 (S110). Then, data storage device 1000 determines whether the merge operation is completed (S120). The merge operation is completed when valid data in the source block(s) is completely copied to a free block. Where the merge operation is determined not to be completed (S120=No), steps S100, S110, and S120 are repeated unit valid data in the source block(s) is completely copied to a free block. Where the merge operation is determined to be completed, source blocks are erased (S130). Erased blocks are assigned to free blocks by memory translation layer 1200. Alternatively, a free block in which compressed data is stored is assigned to a data block by memory translation layer 1200. Afterwards, the procedure is ended.

Figure 9:
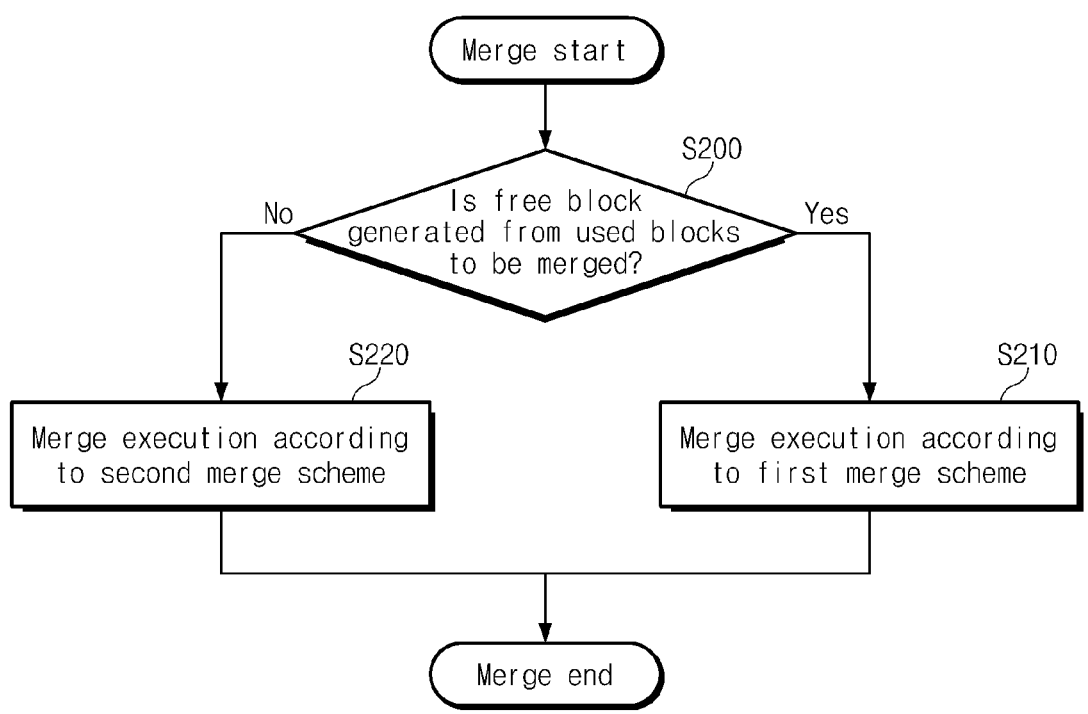
FIG. 9 is a flowchart illustrating a merge operation of a data storage device according to another embodiment of the inventive concept.

FIG. 9 is a flowchart illustrating a merge operation of data storage device 1000 according to another embodiment of the inventive concept. FIGS. 10A and 10B are diagrams illustrating different merging schemes that can be used in the merge operation of FIG. 9.

Referring to FIGS. 9 and 10, upon commencement of a merge operation, data storage device 1000 determines whether a free block can be generated from used blocks to be merged (S200). By default, the number of used blocks to be merged can be determined according to a first merge scheme illustrated in FIG. 10A, which will be described below.

Where a free block can be created through a merge operation of used blocks (S200=Yes), the merge operation is executed according to the first merge scheme of FIG. 10A (S210). In the first merge scheme, as illustrated in FIG. 10A, multiple used blocks (e.g., 3 blocks) are selected as blocks to be merged. Compression and merge operations for the used blocks thus selected executed in the same manner as described in FIGS. 7 and 8.

Where no free block can be created through a merge operation of used blocks (S200=No), the merge operation is executed according to a second merge scheme illustrated in FIG. 10B (S220). In the second merge scheme, as illustrated in FIG. 10B, multiple used blocks (e.g., 4 blocks) are selected as blocks to be merged. A merge operation for the used blocks thus selected is executed in the same manner as described in FIGS. 7 and 8 except that a compression operation is not executed.

The first merge scheme differs from the second merge scheme in that a compression operation is executed and fewer used blocks are merged than in the second merge scheme. Accordingly, the first merge scheme can potentially save time and produce more free blocks than the second merge scheme.

In some embodiments, data blocks in a data block group store both compressed data and uncompressed data. Where a merge operation is required, data blocks to be merged are selected from a data block group having a relatively high ratio of uncompressed data.

Figure 11:
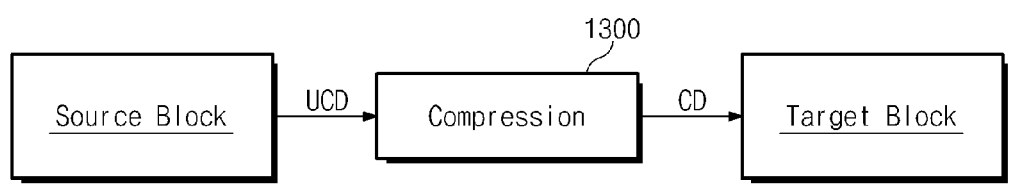
FIG. 11 is a diagram illustrating a copy-back operation of a data storage device according to an embodiment of the inventive concept.

FIG. 11 is a diagram illustrating a copy-back operation of a data storage device according to an embodiment of the inventive concept.

Referring to FIG. 11, where the copy-back operation as a background operation, uncompressed data UCD is read out from a source block. Uncompressed data UCD is then compressed by compression block 1300 to generate compressed data CD. Compressed data CD is then stored in a target block. For example, uncompressed data CD can be sequentially read out from the source block in a LWU unit, and then compressed by compression block 1300. Compressed data CD can then be stored in a LWU of a target block.

The quantity of uncompressed data UCD that can be stored in a page of a target block can change according to a compression rate used to generate compressed data CD. Where the data stored in the source block is compressed data, the copy-back operation is not accompanied by a compression operation. Whether the data stored in a source block is compressed data can be determined according to a compression mapping table as described above.

Figure 12:
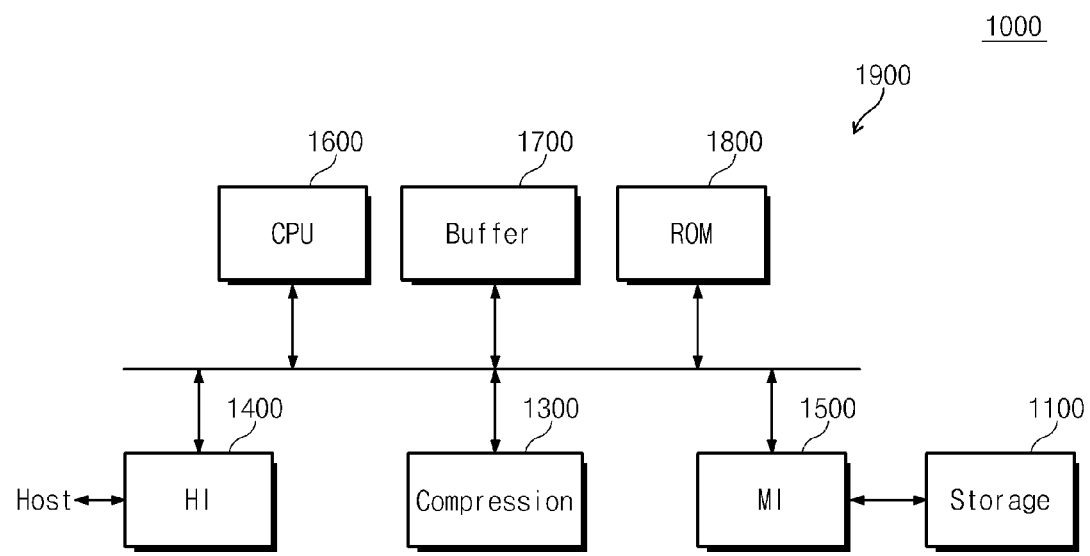
FIG. 12 is a block diagram illustrating a controller of a data storage device according to an embodiment of the inventive concept.

FIG. 12 is a block diagram illustrating a controller of data storage device 1000 according to an embodiment of the inventive concept.

Referring to FIG. 12, data storage device 1000 comprises storage medium 1100 and a controller 1900. Controller 1900 comprises compression block 1300, a first interface 1400, a second interface 1500, a central processing unit (CPU) 1600, a buffer 1700, and a read only memory (ROM) 1800.

First interface 1400 is configured to interface with an external device, such as a host. Second interface 1500 is configured to interface with storage medium 1100. CPU 1600 is configured to control the operation of controller 1900. For example, CPU 1600 can be configured to execute firmware such as a memory translation layer MTL stored in ROM 1800. The MTL in ROM 1800 can be used to manage memory mapping information and data division. The MTL can also be used to manage other operations, such as wear-leveling, bad blocks, data retention in the presence of unexpected power interruptions.

Buffer 1700 is used to temporarily store data transferred from an external source via first interface 1400. Buffer 1700 is used to temporarily store data transferred from storage medium 1100 via second interface 1500.

Compression block 1300 operates under the control of CPU 1600, or under the control of the MTL executed by CPU 1600, to compress data stored in buffer 1700. Compressed data is stored in storage medium 1100 via second interface 1500. Compression block 1300 operates under the control of CPU 1600, or under the control of the MTL executed by CPU 1600, to decompress data or release compressed data read out of storage medium 1100.

In the event that the compression block 1300 is located within controller 1900, data to be compressed during a background operation is read from storage medium 1100, and read data is compressed by compression block 1300. Thereafter, the compressed data is stored in storage medium 1100 via second interface 1500.

Figure 13:
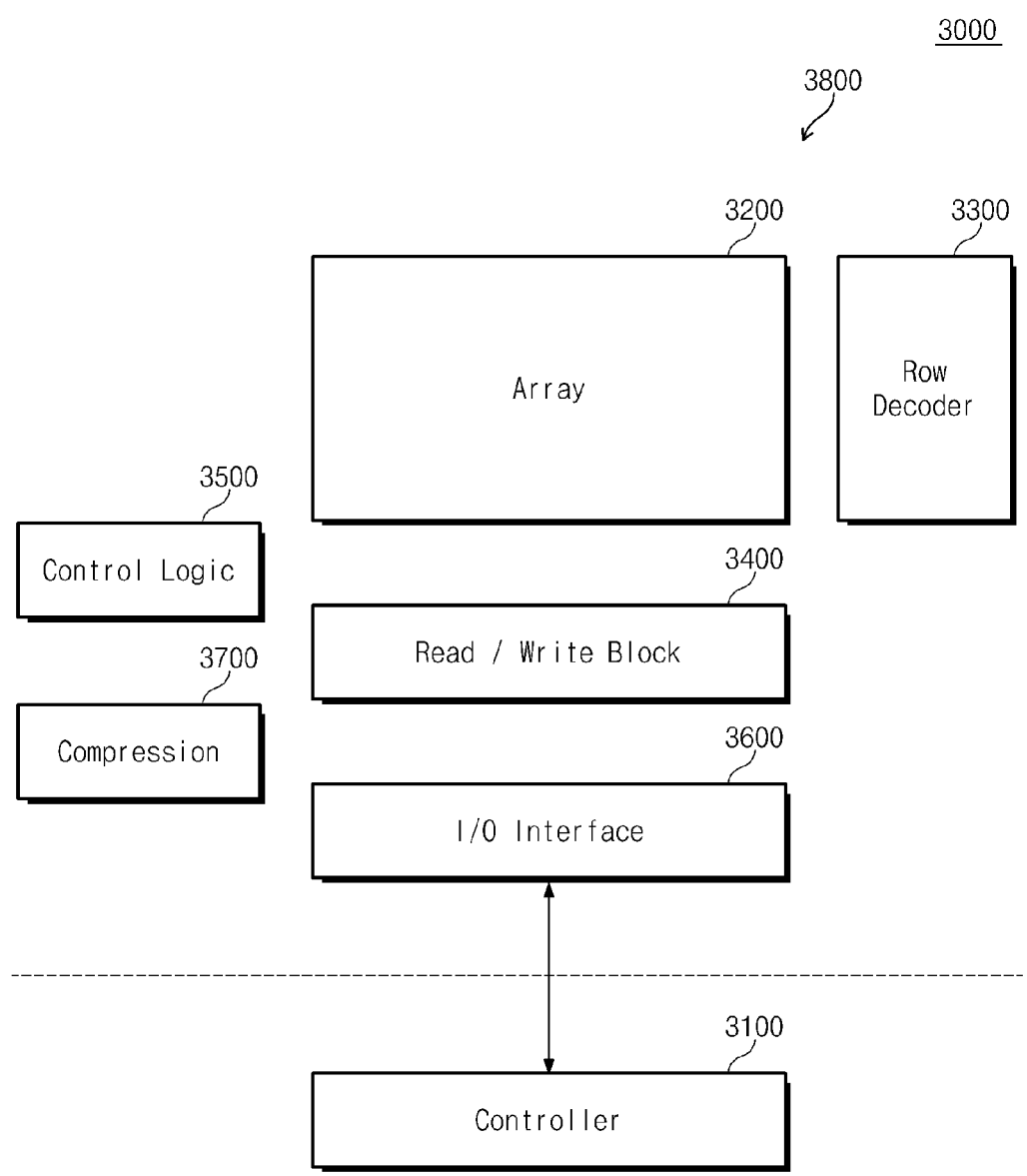
FIG. 13 is a block diagram illustrating a data storage device according to another embodiment of the inventive concept.

FIG. 13 is a block diagram illustrating a data storage device 3000 according to another embodiment of the inventive concept.

Referring to FIG. 13, data storage device 3000 comprises a controller 3100 and a storage medium 3800. Controller 3100 is configured to control the operation of storage medium 3800. Storage medium 3800 comprises a cell array 3200, a row decoder circuit 3300, a read/write block 3400, control logic 3500, an input/output interface 3600, and a compression block 3700.

Cell array 3200 comprises a plurality of memory blocks. These memory blocks can be divided into data blocks, log blocks, and free blocks by a memory translation layer MTL. Row decoder circuit 3300 is configured to select and drive rows of cell array 3200, and read/write block 3400 is configured to read and write data to and from cell array 3200. Control logic 3500 is configured to control the operation of storage medium 3800. Input/output interface 3600 is configured to interface with controller 3100. Compression block 3700 is configured to compress data read through read/write block 3400 in response to a request from controller 3100 or control logic 3500 during a background operation of data storage device 3000. Data compressed by compression block 3700 is stored in cell array 3200 through read/write block 3400 under the control of control logic 3500.

Figure 14:
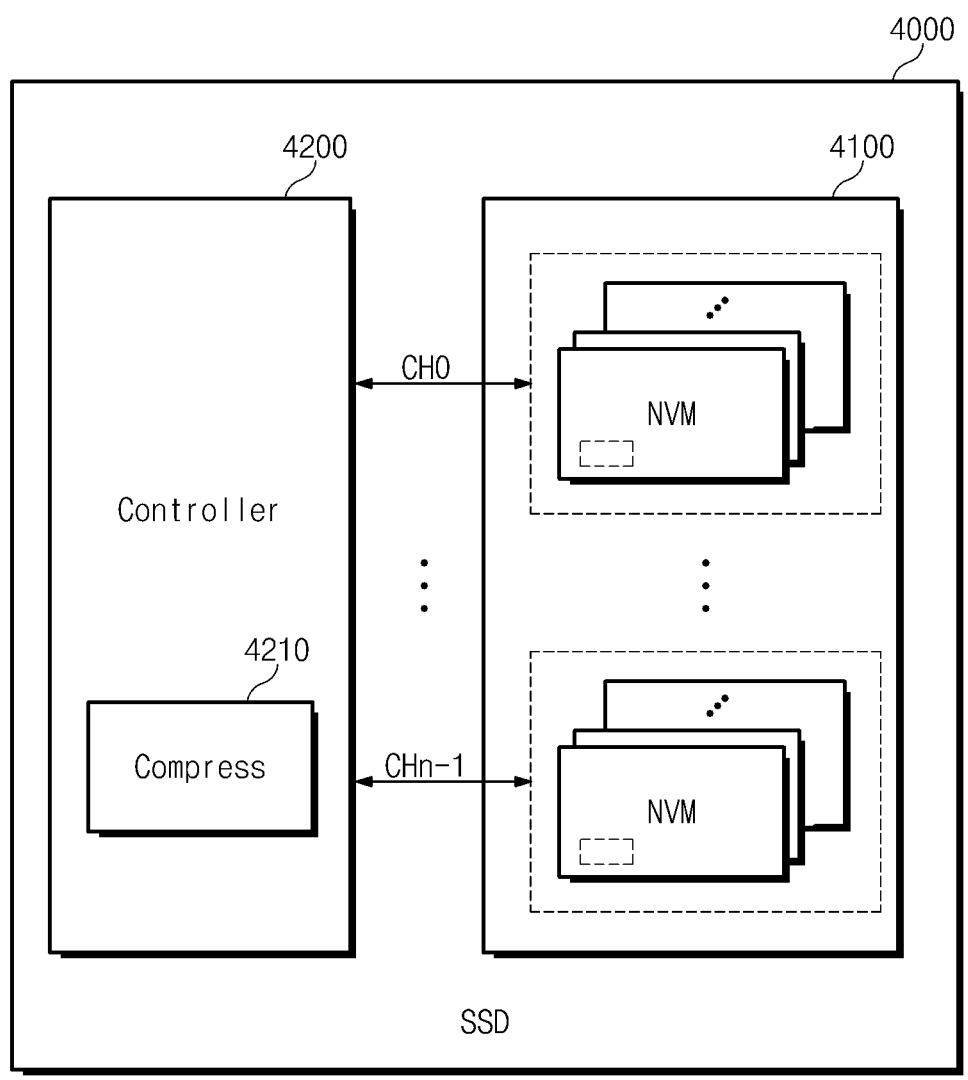
FIG. 14 is a block diagram illustrating an SSD configured to implement a data compression technique according to an embodiment of the inventive concept.

FIG. 14 is a block diagram illustrating an SSD 4000 configured to implement a data compression technique according to an embodiment of the inventive concept.

Referring to FIG. 14, SSD 4000 comprises a storage medium 4100 and a controller 4200. Storage medium 4100 is connected to controller 4200 through a plurality of channels CH0~CHn−1 each commonly connected with a plurality of nonvolatile memories NVM. Controller 4200 comprises a compression block 4210 that compresses data and decompresses data. Data compression is performed during a background operation such as an idle operation, a merge operation, or a copy-back operation. A compression block (illustrated by a dotted line) can be provided within each nonvolatile memory of storage medium 4100 instead of controller 4200.

Figure 15:
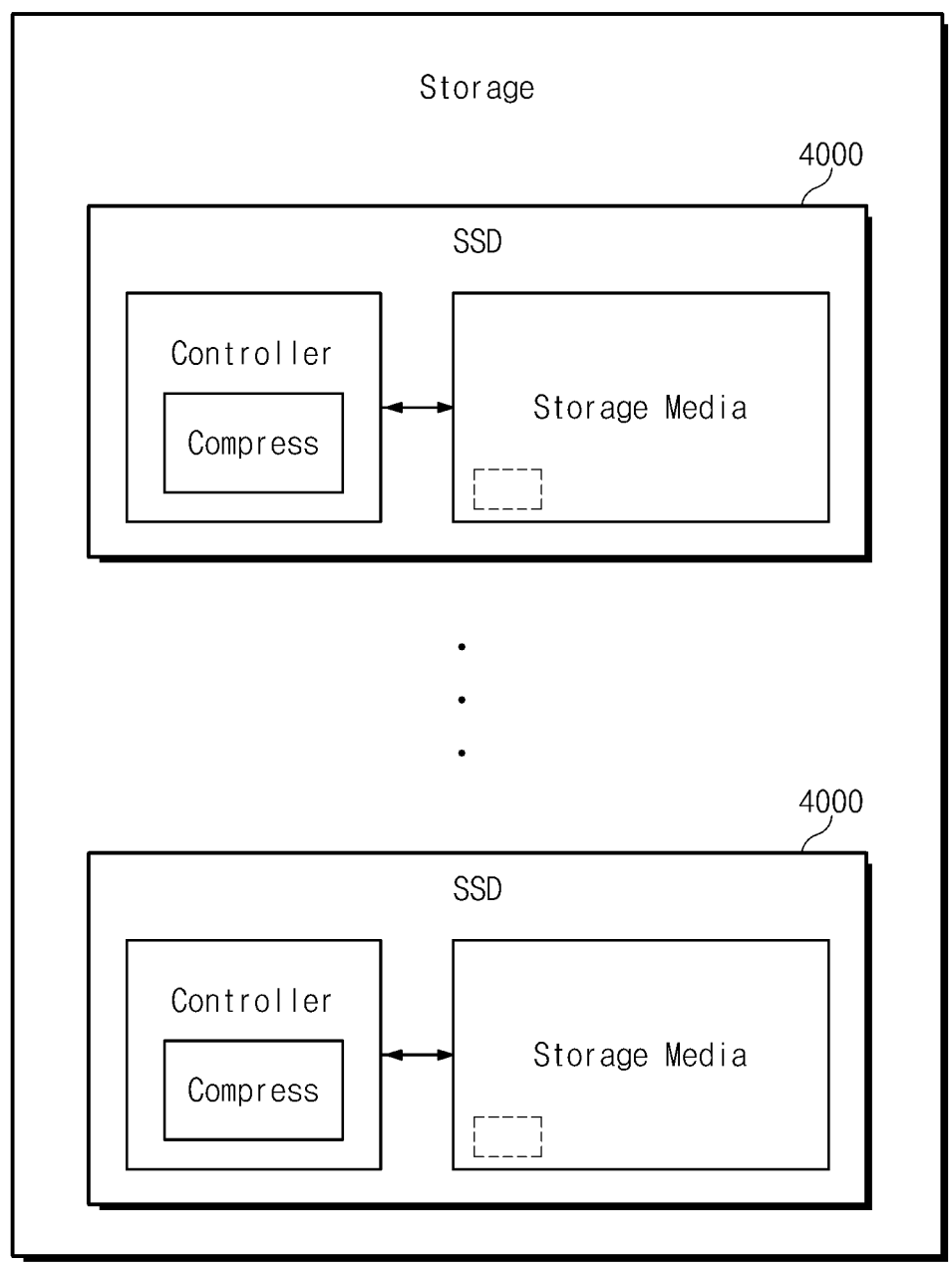
FIG. 15 is a block diagram illustrating a data storage device incorporating the SSD of FIG. 14.
Figure 16:
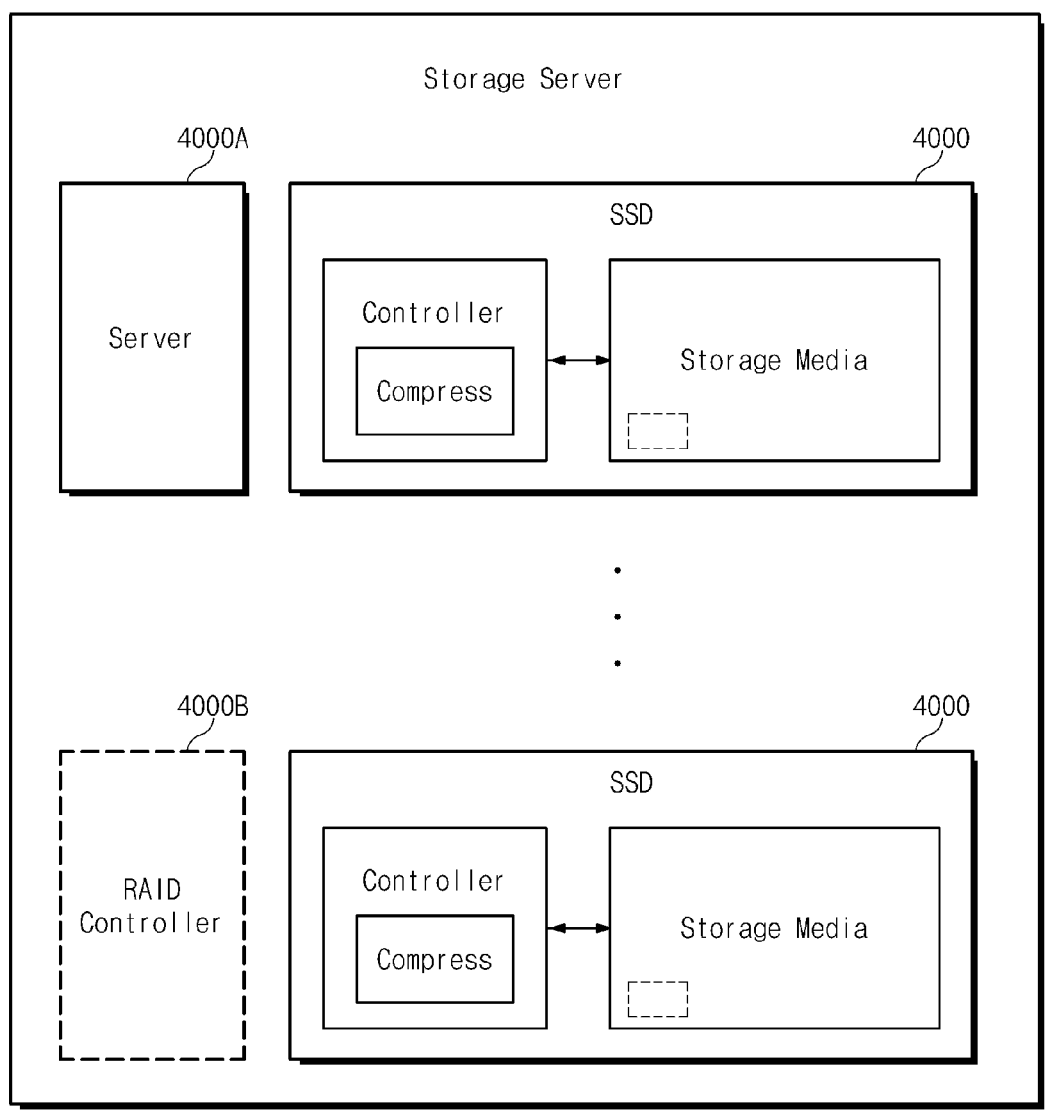
FIG. 16 is a block diagram illustrating a storage server incorporating the SSD of FIG. 14.

FIG. 15 is a block diagram illustrating a data storage device incorporating SSD 4000 of FIG. 14. FIG. 16 is a block diagram illustrating a storage server incorporating SSD 4000 of FIG. 14.

In the embodiment of FIG. 15, the data storage device comprises a plurality of SSDs 4000 configured the same as described in FIG. 14. In the embodiment of FIG. 16, a storage server comprises a plurality of solid state drives 4000 configured the same as described in FIG. 14, and a server 4000A. In addition, a redundant array of independent disks (RAID) controller 4000B is provided in the storage server. In the embodiments of FIGS. 15 and 16, a compression block (illustrated by a dotted line) can be provided within each nonvolatile memory of storage medium 4100 instead of controller 4200.

Figure 17:
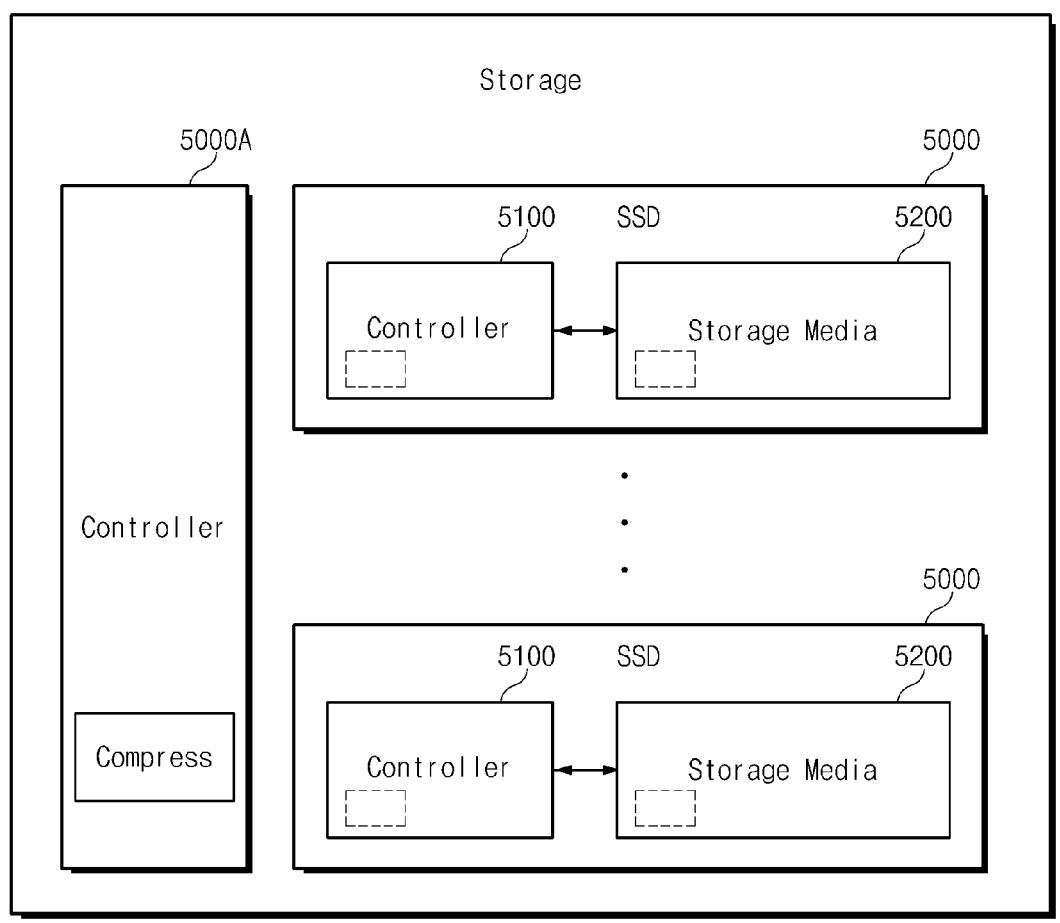
FIG. 17 is a block diagram illustrating a data storage device according to another embodiment of the inventive concept.
Figure 18:
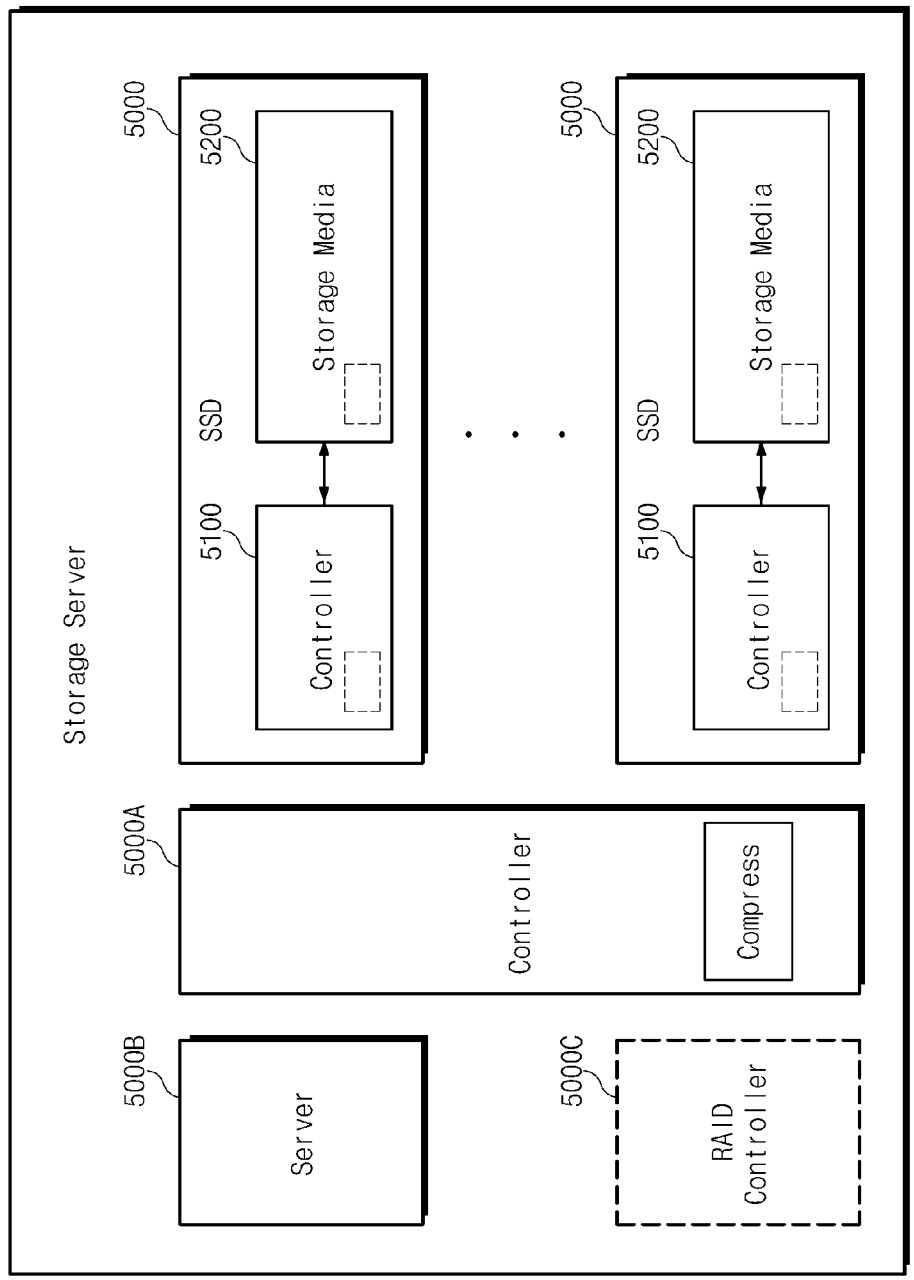
FIG. 18 is a block diagram illustrating a storage server incorporating the data storage device of FIG. 17.

FIG. 17 is a block diagram illustrating a data storage device according to another embodiment of the inventive concept, and FIG. 18 is a block diagram illustrating a storage server incorporating the data storage device of FIG. 17.

Referring to FIG. 17, the data storage device comprises a plurality of SSDs 5000 and a control block 5000A. Each of SSDs 5000 comprises a controller 5100 and a storage medium 5200. Controller 5100 is configured to perform an interface function with storage medium 5200. SSDs 5000 are controlled by control block 5000A. Control block 5000A is configured to perform the various functions described above, such as background operations including data compression. The data storage device of FIG. 17 is used to configure a storage server.

Referring to FIG. 18, the storage server comprises a server 5000B and a data storage device (e.g., 5000, 5000A) configured similar to that of FIG. 17. A RAID controller 5000C is also provided in the storage server. In the embodiments of FIGS. 17 and 18, a compression block (illustrated by a dotted line) can be provided within controller 5100 of SSD 5000 or storage medium 5200 instead of control block 5000A.

Figure 19:
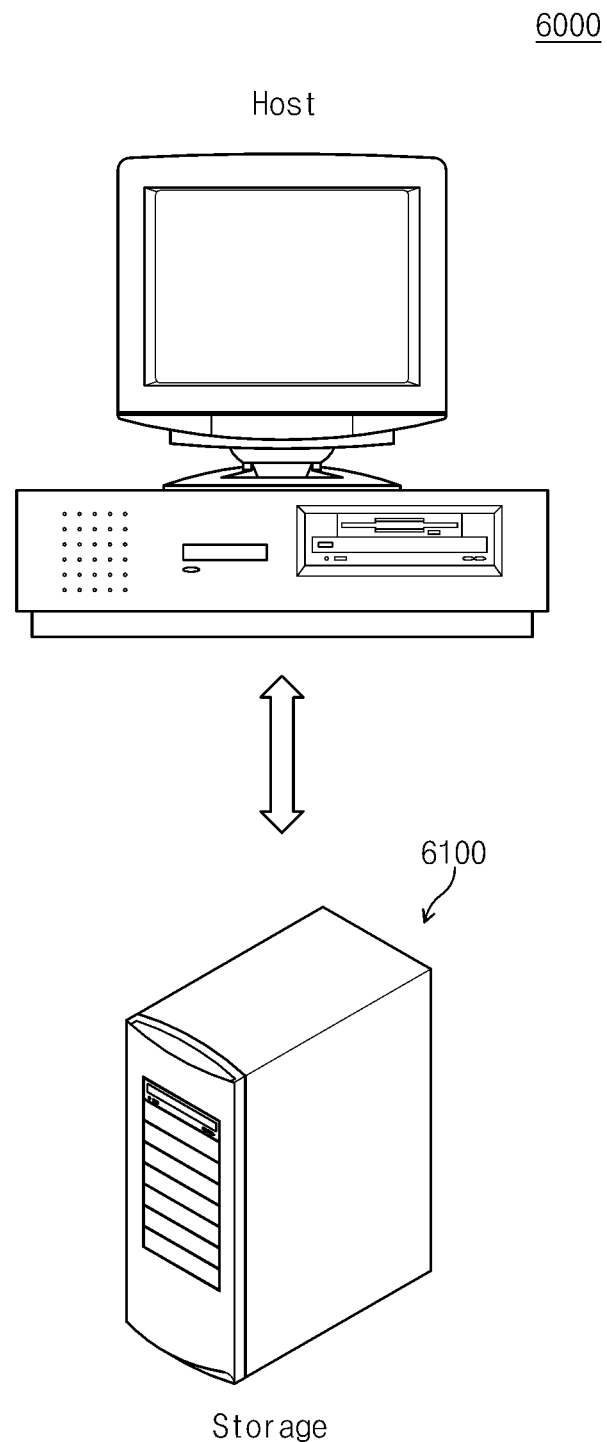
FIGS. 19 through 21 are diagrams illustrating systems that can incorporate a data storage device according to various embodiments of the inventive concept.
Figure 20:
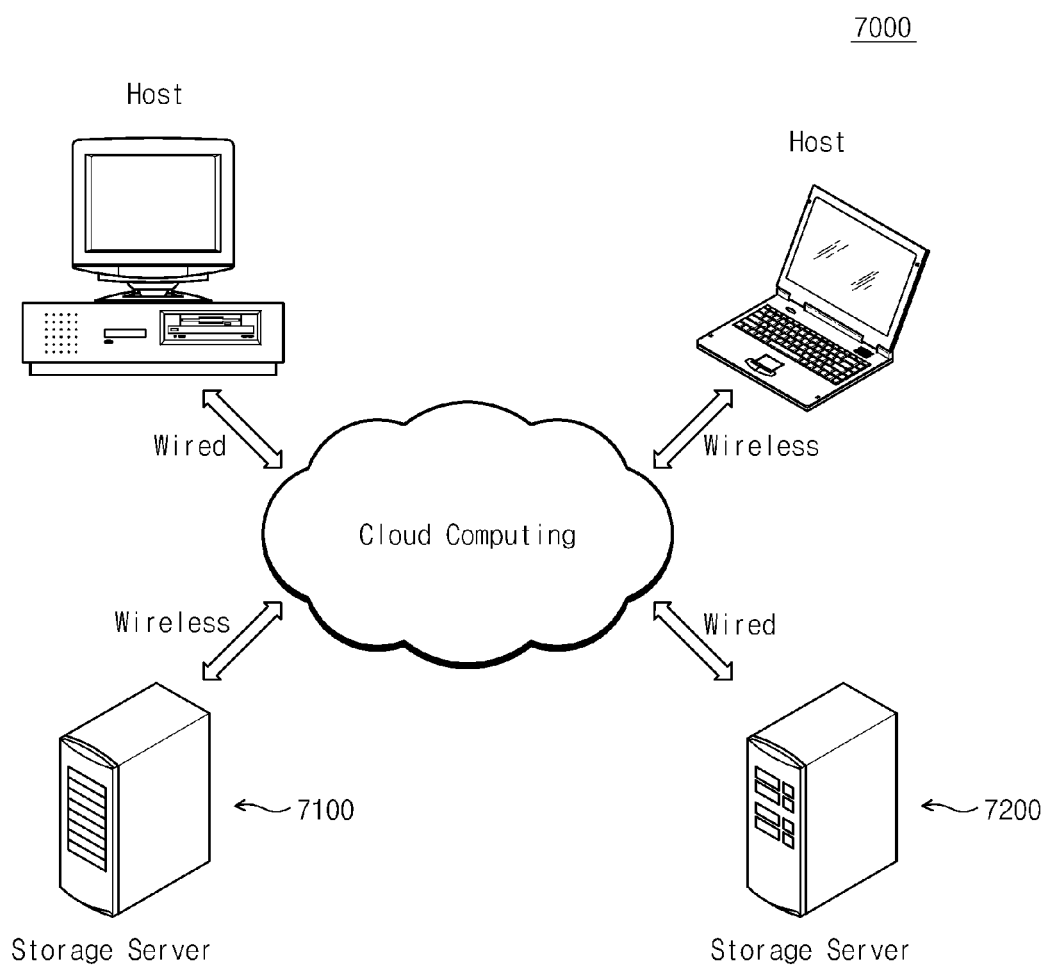
Figure 21:
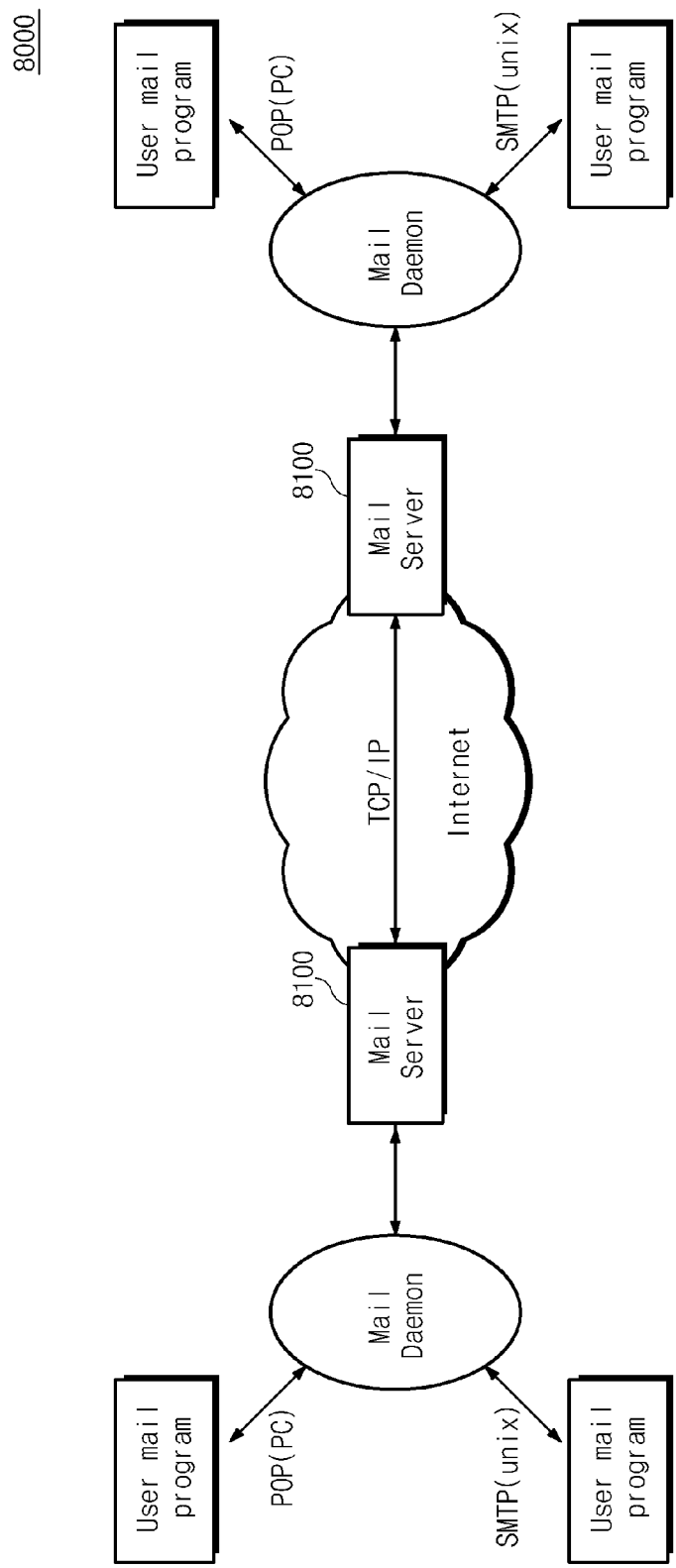

FIGS. 19 through 21 are diagrams illustrating systems that can incorporate a data storage device according to various embodiments of the inventive concept.

Referring to FIG. 19, a system 6000 comprises a storage 6100 that communicates with a host in a wired or wireless manner. Storage 6100 can incorporate a data storage device such as those described above.

Referring to FIG. 20, a system 7000 comprises storage servers 7100 and 7200 that communicate with a host in a wired or wireless manner. Storage servers 7100 and 7200 can incorporate data storage devices such as those described above.

Referring to FIG. 21, a system 8000 comprises mail servers 8100 connected to each other through the Internet, and connected to user mail programs through mail daemons. The mail servers can incorporate data storage devices such as those described above.

In various embodiments of the inventive concept, data compression is implemented according to one of several compression schemes. Examples of such compression schemes include LZ77&LZ78, LZW, Entropy encoding, Huffman coding, Adpative Huffman coding, Arithmetic coding, DEFLATE, and JPEG.

In various embodiments of the inventive concept, the first interface of a controller is implemented according to one of various computer bus standards, storage bus standards, peripheral bus standards, or a combination of two or more standards. Examples of such computer bus standards include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, and Hyper Transport. Examples of such storage bus standards include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, and FCIP. Examples of peripheral bus standards include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, and Multidrop Bus.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of storing data in a storage medium of a data storage device, comprising:
    storing input data in the storage medium; and
    reading the input data from the storage medium and compressing the read input data during a background operation of the data storage device;
    wherein the background operation comprises a merge operation, and compressing data stored in the storage medium comprises:
    determining whether a free block can be generated by merging "M" selected memory blocks to be merged using a first merge scheme;
    performing the merge operation according to the first merge scheme if a free block can be generated by merging the "M" selected memory blocks using the first merge scheme; and
    performing the merge operation according to a second merge scheme different from the first merge scheme if a free block cannot be generated by merging the "M" selected memory blocks using the first merge scheme;
    wherein the first merge scheme comprises reading valid data from "M" used memory blocks in the storage medium as the read input data, compressing the read valid data to generate compressed data, and storing the compressed data in free memory blocks of the storage medium; and
    wherein the second merge scheme comprises reading valid data from "N" used memory blocks in the storage medium as the read input data, where N is greater than M, and storing the read valid data in free memory blocks of the storage medium.

2. The method of claim 1, further comprising:
    determining whether the input data is compressed data and generating a compression indicator indicating whether the input data is compressed data; and storing the compression indicator in a header or footer of the input data or a spare area of a memory block in which the input data is stored.

3. The method of claim 2, wherein the determination of whether the input data is compressed data is made by identifying a compression rate of the input data.

4. The method of claim 2, wherein the determination of whether the input data is compressed data is made according to a size of the input data.

5. The method of claim 1, further comprising:
receiving information indicating whether the input data is compressed data; and storing the received information in a compression mapping table, a header or footer of the input data, or a spare area of a memory block in which the input data is to be stored.

6. The method of claim 1, wherein compressing the read data comprises:
reading valid data from a source block of the storage medium as the read input data;
compressing the read valid data to generate compressed data; and storing the compressed data in a target block of the storage medium.

7. The method of claim 6, wherein the source block is erased after the merge operation is completed.

8. The method of claim 1, further comprising erasing the "N" or "M" used memory blocks after the merge operation is completed.

9. A data storage device, comprising:
a storage medium comprising memory blocks;
a memory translation layer configured to select "M" memory blocks of the storage medium in which input data is to be stored; and
a compression block configured to compress data stored in the "M" selected memory blocks during a background operation of the data storage device;
wherein the background operation comprises a merge operation, and data compression is accomplished by determining whether a free block can be generated by merging the "M" selected memory blocks using a first merge scheme, performing the merge operation according to the first merge scheme if a free block can be generated by merging the "M" selected memory blocks using the first merge scheme, and performing the merge operation according to a second merge scheme different from the first merge scheme if no free block can be generated by merging the "M" selected memory blocks using the first merge scheme;
wherein the first merge scheme comprises reading valid data from "M" used memory blocks in the storage medium as the read input data, compressing the read valid data to generate compressed data, and storing the compressed data in free memory blocks of the storage medium; and
wherein the second merge scheme comprises reading valid data from "N" used memory blocks in the storage medium as the read input data, where N is greater than M and storing the read valid data in free memory blocks of the storage medium.

10. The data storage device of claim 9, wherein data compression is accomplished by reading valid data from a source block among the memory blocks as the read input data, compressing the read valid data to generate compressed data, and storing the compressed data in a target block among the memory blocks.

11. A method of operating a data storage device, comprising:
storing input data in a log block;
updating a log block mapping table to reflect the storage of the input data in the log block;
during a background operation of the data storage device, reading the input data from the log block, compressing the read input data to produce compressed data, and storing the compressed data in a data block; and
updating a data block mapping table to reflect storage of the compressed data in the data block;
wherein the background operation comprises a merge operation, and data compression is accomplished by determining whether a free block can be generated by merging the log block with at least one other memory block using a first merge scheme, performing the merge operation according to the first merge scheme if a free block can be generated by the merging using the first merge scheme, and performing the merge operation according to a second merge scheme different from the first merge scheme if no free block can be generated by the merging using the first merge scheme;
wherein the first merge scheme comprises reading valid data from "M" used memory blocks in the storage medium as the read input data, compressing the read valid data to generate compressed data, and storing the compressed data in free memory blocks of the storage medium; and
wherein the second merge scheme comprises reading valid data from "N" used memory blocks in the storage medium as the read input data, where N is greater than M and storing the read valid data in free memory blocks of the storage medium.

12. The method of claim 11, wherein the data block mapping table further comprises a compression mapping table indicating whether stored data is compressed.

* * * * *